United States Patent
Hellberg

(10) Patent No.: US 10,944,369 B2
(45) Date of Patent: Mar. 9, 2021

(54) AMPLIFIER CIRCUIT AND METHOD FOR COMPENSATING AN OUTPUT SIGNAL PROVIDED AT AN OUTPUT OF THE AMPLIFIER CIRCUIT

(71) Applicant: Telefonaktiebolaget LM Ericsson (publ), Stockholm (SE)

(72) Inventor: Richard Hellberg, Huddinge (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 5 days.

(21) Appl. No.: 16/313,073

(22) PCT Filed: Jul. 14, 2016

(86) PCT No.: PCT/SE2016/050715
§ 371 (c)(1),
(2) Date: Dec. 24, 2018

(87) PCT Pub. No.: WO2018/013022
PCT Pub. Date: Jan. 18, 2018

(65) Prior Publication Data
US 2019/0165746 A1    May 30, 2019

(51) Int. Cl.
*H03F 3/60* (2006.01)
*H03F 1/32* (2006.01)

(52) U.S. Cl.
CPC .......... *H03F 3/605* (2013.01); *H03F 1/3229* (2013.01); *H03F 2200/192* (2013.01); *H03F 2200/198* (2013.01); *H03F 2200/204* (2013.01); *H03F 2201/3212* (2013.01); *H03F 2201/3221* (2013.01)

(58) Field of Classification Search
CPC .. H03F 3/605; H03F 1/3229; H03F 2200/192; H03F 2200/198; H03F 2200/204; H03F 2201/3212; H03F 2201/3221

USPC ..................... 330/286, 295, 124 R
See application file for complete search history.

(56) References Cited

U.S. PATENT DOCUMENTS 4,352,072 A * 9/1982 Harrington ............... H03F 1/08
330/124 R
6,573,792 B1    6/2003 Olson et al.

FOREIGN PATENT DOCUMENTS

| EP | 0245955 A2 | 11/1987 |
|---|---|---|
| EP | 1158661 A2 | 11/2001 |
| WO | 2016056952 A1 | 4/2016 |
| WO | 2016056953 A1 | 4/2016 |

(Continued)

OTHER PUBLICATIONS

Seidel, H., "A Microwave Feed-Forward Experiment", American Telephone and Telegraph Company; The Bell System Technical Journal; vol. 50, No. 9; USA, Nov. 1971, pp. 1-38.

*Primary Examiner* — Khanh V Nguyen
*Assistant Examiner* — Khiem D Nguyen
(74) *Attorney, Agent, or Firm* — Murphy, Bilak & Homiller, PLLC

(57) ABSTRACT

An amplifier circuit for compensating an output signal provided at an output of the amplifier circuit comprises a cascade of sub-amplifiers. Each sub-amplifier of the cascade contributes to a respective part of the output signal. The cascade of sub-amplifiers comprises an end sub-amplifier and at least one preliminary sub-amplifier. At least one error correction block is coupled to apply feedforward error correction to an output of one of the at least one preliminary sub-amplifier.

21 Claims, 14 Drawing Sheets

(56) References Cited

FOREIGN PATENT DOCUMENTS

| WO | 2016182485 A1 | 11/2016 |
|---|---|---|
| WO | 2017074229 A1 | 5/2017 |
| WO | 2017082776 A1 | 5/2017 |

\* cited by examiner

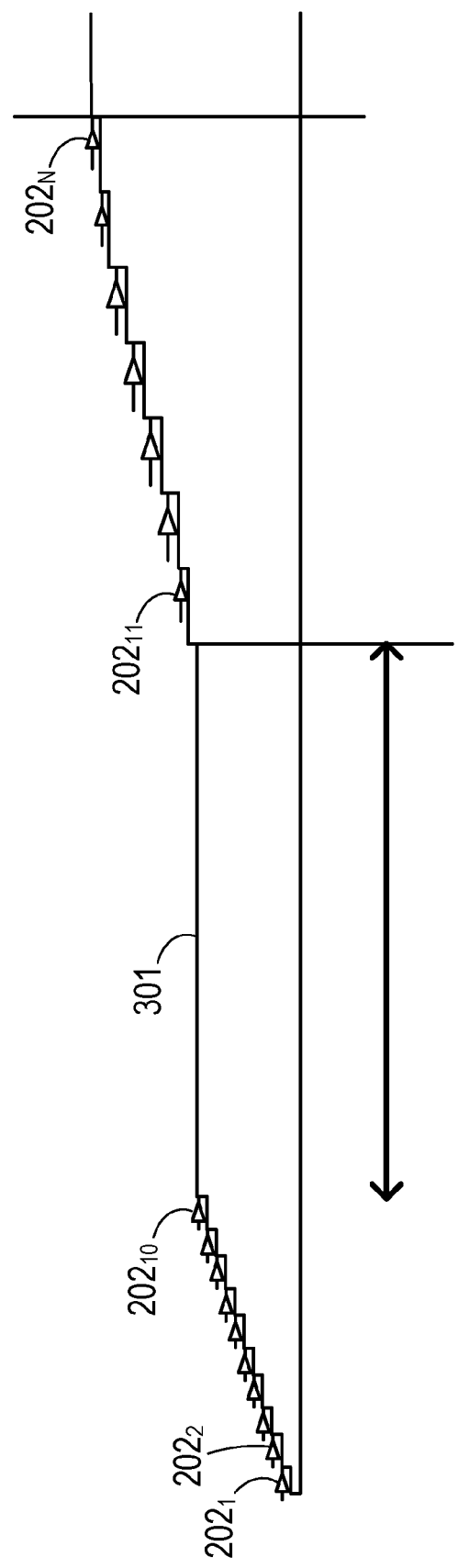

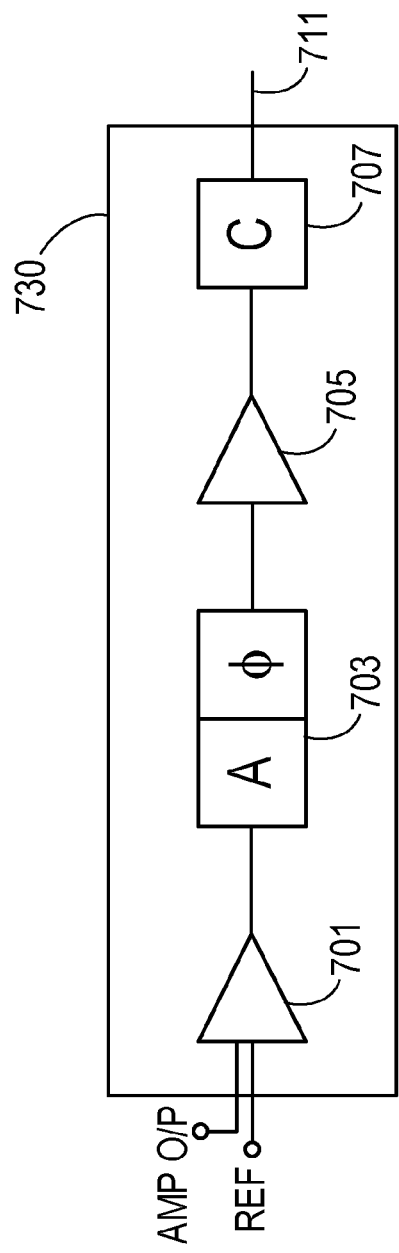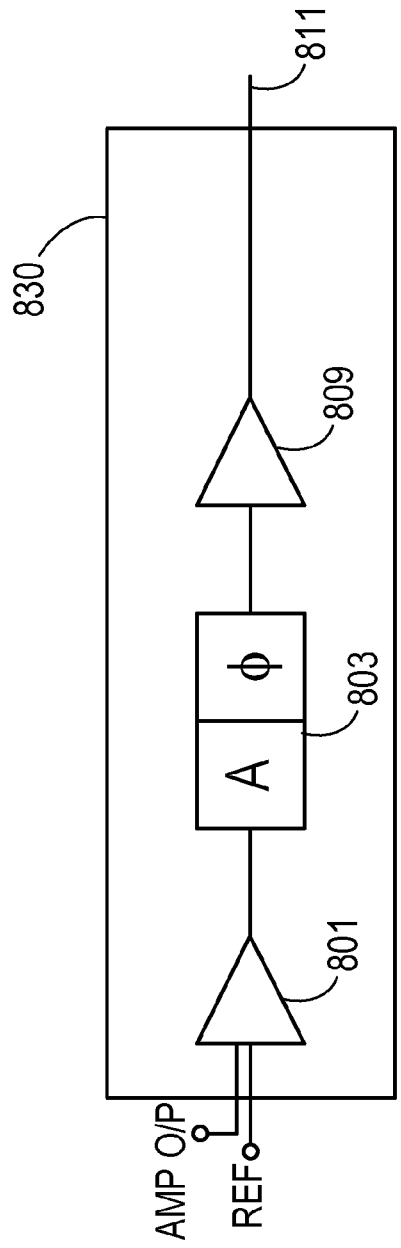

AMPLIFIER CIRCUIT AND METHOD FOR COMPENSATING AN OUTPUT SIGNAL PROVIDED AT AN OUTPUT OF THE AMPLIFIER CIRCUIT

TECHNICAL FIELD

Embodiments herein relate to an amplifier circuit and method for compensating an output signal provided at an output of the amplifier circuit. Furthermore, radio network nodes and user equipments in wireless communication systems, and electronic devices in general comprising the amplifier circuit are disclosed.

BACKGROUND

Amplifiers with very large bandwidths, low ripple, and high efficiency in wide amplitude ranges have recently been introduced. They have properties that differ in various ways, but they all share that they can be designed so that each amplifier section in a cascade adds its power over a limited amplitude range on top of what the previous sections have provided (except for the first amplifier, which starts from zero).

Digital predistortion (DPD) is a linearization technique that works by providing an inversely nonlinear input signal to a nonlinear amplifier, so that the output signal becomes linear. To shape the nonlinear input signal it samples the output of the amplifier and adaptively creates a model of the amplifier to provide an inverse nonlinearity to run the input signal through. An advantage of this technique is that the efficiency of the amplifier itself is largely unaffected.

Feedforward (FF) correction is a linearization technique that works by injecting a corrective signal after a nonlinear main amplifier to restore linearity. Its main parts are error extraction, i.e. comparing the main amplifier output signal with a reference signal, amplification of the difference (error), and error injection. Sampling of the main amplifier output and error injection are both usually handled by directional couplers. A delay line in the output line after the main amplifier ensures that the main amplifier signal and the error signal (which is delayed by amplifiers and other circuits) are in sync at the injection point.

An example of a schematic of such a feedforward correction circuit is shown in FIG. 1. With this method error extraction is performed by a first signal sampling coupler C3 shown in FIG. 1. An amplified output signal from the main amplifier A1 is sampled by a signal sampling coupler C2, the first signal sampling coupler C3 then compares the sampled signal with a reference input signal IN and outputs an error signal. The reference input signal IN is delayed by a transmission line or a delay filter L1 in order to be in sync with the amplified output signal from the main amplifier A1. The error signal is then amplified by an error amplifier A2 to a corrective or compensation signal and injected by an element C4 to an output, OUT. A delay line L2 after the main amplifier A1 ensures that the corrective, or compensation, signal is injected in sync with the output signal from the main amplifier A1. The box marked with X may be an inversion, or inverter, in the cases where the main amplifier A1 is a non-inverting amplifier. Feedforward systems are often described in terms of "loops", i.e. an error extraction loop followed by an error injection loop.

Error injection performed by element C4 in FIG. 1 is handled, for example, by either a transformer or a directional coupler. A directional coupler has the advantage that it has high backwards isolation, i.e. the injected signal mainly goes forward to the output, whereas the transformer sends half of the injected signal power back towards the main amplifier A1.

An advantage of feedforward correction is that it can handle any type of error: noise, gain, frequency response variations, and all types of distortion including nonlinear memory effects with arbitrary time constants, negative gain regions and even hysteresis. Feedforward correction can do this at high frequencies, over wide bandwidths and without knowledge of the specific error processes involved.

However, a disadvantage of feedforward correction is low efficiency. In directional coupler based feedforward correction as shown in FIG. 1, this is partly due to coupling loss in the error injection coupler C4. Low efficiency in the error amplifier A2 is also a potential problem in feedforward systems, and the efficiency scales differently with the amplitudes of the voltages involved.

In the case of coupler-based feedforward correction as shown in FIG. 1, only the error signal amplitude determines the efficiency of the error amplifier A2. Low efficiency in the error amplifier A2 results if the average error voltage is relatively small, but a large maximum error needs to be accommodated (i.e. low peak-to-average ratio). The average voltage drops across transistors are then high relative to the signal voltage, and the efficiency is low. The coupler loss is low for errors that are proportional (by the coupling coefficient) to the main output signal (OUT), but can be high for errors of other magnitudes and phases.

On the other hand, a disadvantage of the digital predistortion, DPD, technique is that DPD cannot counteract noise and handles several types of distortion poorly, or not at all. The predistortion signal generally has much higher bandwidths than the desired output signal, especially for compression, low or negative gain slope regions and sharp kinks in the transfer function. The signal processing complexity, and consequentially size and power consumption, can be high for complex error processes.

DPD and FF scale differently with bandwidth and output power. The FF cost in terms of power is rather independent of bandwidth and largely proportional to output power, i.e. it has largely the same efficiency degradation regardless of power. DPD has a cost that it largely proportional to bandwidth and has otherwise more or less fixed costs per output signal that do not depend on the output power level.

These differences in scaling have a large impact for systems with large bandwidths and many antennas and/or low output power per antenna. Consider, for example, going from a system with 100 MHz bandwidth and 4 antennas to a system with 1 GHz bandwidth and 128 antennas (roughly the transition between 4G systems of today and the new 5G systems). While the relative cost of a FF system is largely unchanged by this transition, the relative cost of the DPD system can increase by a factor of about 320.

While feedforward correction systems can have advantages such as the above relating to cost, for example when scaling, the use of such feedforward linearization systems for correcting the output of high-efficiency amplifiers can be non-efficient when operating at backed off amplitudes.

Examples of Background Art can be Found in EP0245955A2 and EP01158661A2.

SUMMARY

According to the embodiments described herein, according to a first aspect there is provided an amplifier circuit for compensating an output signal provided at an output of the amplifier circuit. The amplifier circuit comprises a cascade of sub-amplifiers, each sub-amplifier of the cascade contributing to a respective part of the output signal. The cascade of sub-amplifiers comprises an end sub-amplifier and at least one preliminary sub-amplifier. At least one error correction block is coupled to apply feedforward error correction to an output of one of the at least one preliminary sub-amplifier.

By interspersing at least one feedforward error correction block within the sub-amplifier stages, this has an advantage of enabling local error correction to be provided in-between amplifier sections, and the error correction to be performed while at a lower relative amplitude level, i.e. since only a part of the amplitude range has been added at these points. This in turn makes it possible to increase the efficiency of feedforward error correction, since the feedforward error correction can be adjusted locally at the point of correction.

According to another aspect, there is provided an amplifier circuit for compensating an output signal provided at an output of a circuit. The amplifier circuit comprises a plurality of amplifier stages, each amplifier stage contributing to a respective part of the output signal. At least one feedforward error correction block is coupled between two of the plurality of amplifier stages.

According to another aspect, there is provided a method for compensating an output signal provided at an output of an amplifier circuit, the amplifier circuit comprising a cascade of sub-amplifiers, each sub-amplifier of the cascade contributing to a respective part of the output signal, and wherein the cascade of sub-amplifiers comprises an end sub-amplifier and at least one preliminary sub-amplifier. The method comprises the steps of applying feedforward error correction to an output of one of the at least one preliminary sub-amplifiers.

BRIEF DESCRIPTION OF THE DRAWINGS

For a better understanding of examples of the present invention, and to show more clearly how the examples may be carried into effect, reference will now be made, by way of example only, to the following drawings in which:

FIG. 3b shows an example of an amplifier circuit having a delay element according to an embodiment;

FIG. 7 shows an example of a feedforward error correcting block according to an embodiment;

FIG. 8 shows an example of a feedforward error correcting block according to an embodiment;

DESCRIPTION

Figure 1:
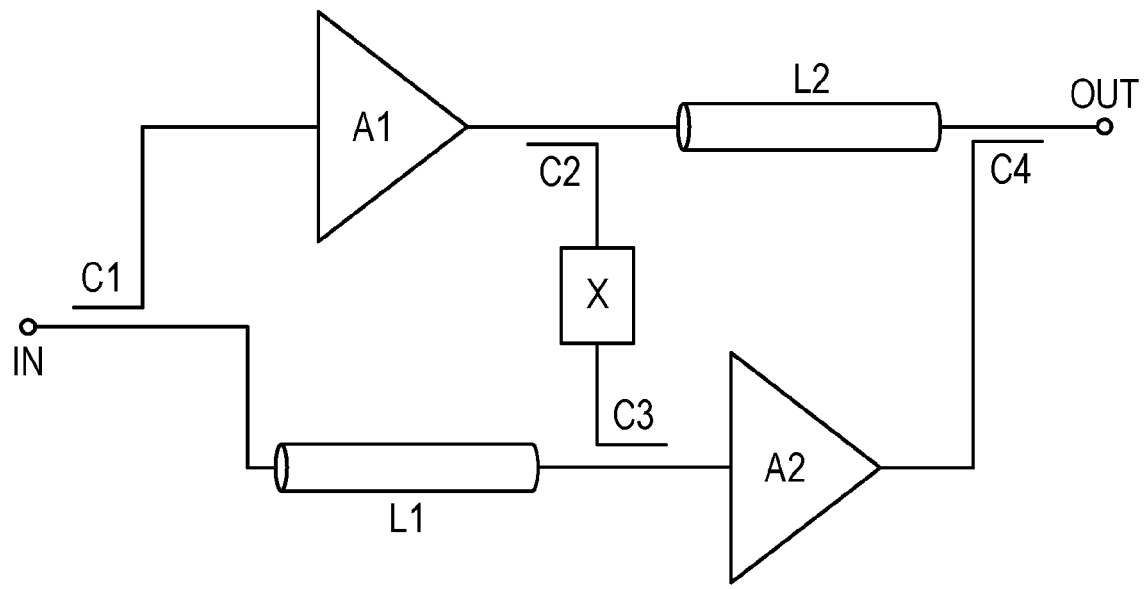
FIG. 1 shows an example of an amplifier having feedforward error correction applied to a final output.

A recent development by the present inventor to the feedforward correction system of FIG. 1, and the subject of a co-pending application, PCT application number PCT/SE2015/051182 filed on 9 Nov. 2015 by the present Applicant, obviates the error injection coupler C4 of FIG. 1 by making the error amplifier A2 itself directional, i.e. using a special amplifier arrangement directly coupled to the output transmission line that sends most of its signal in the forward direction. Such a "directional error amplifier" may be used to replace both the error amplifier A2 and the error injection coupler C4 in FIG. 1.

For a feedforward correction circuit based on this new directional error amplifier, low efficiency can result if the main output signal amplitude is low, since the voltage drops over the transistors are high during such instances. The efficiency at low amplitude levels also scales inversely with the error amplitude, i.e. gets worse for large errors, since this draws more current from the transistors.

The embodiments described herein consist of separating one or more amplifier sections (for example, as in recently invented amplifiers comprising a plurality of sub-amplifiers coupled in a cascade of sub-amplifiers, where each sub-amplifier of the cascade contributes to a respective part of an output signal) with delay elements, for example lengths of transmission line, and performing local error correction in-between the one or more of the amplifier sections.

The recently invented amplifiers can be designed so that each sub-amplifier section in the cascade adds its power mainly over a limited amplitude range on top of what the previous sections have provided. The sub-amplifier sections also then become highly directional, i.e. they only send substantial power in the forward direction. An example of such an amplifier is shown in FIG. 2.

Figure 2:
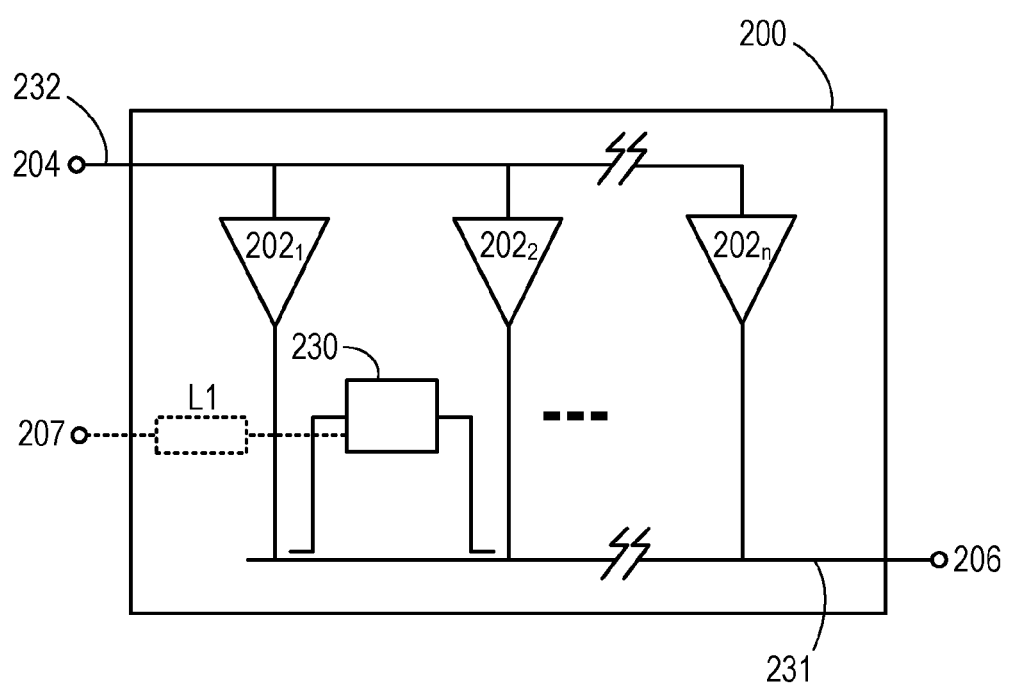
FIG. 2 shows an example of an amplifier circuit according to an embodiment.

FIG. 2 illustrates an example of an amplifier circuit 200 for compensating an output signal 206 provided at an output of the amplifier circuit according to embodiments of the invention.

The amplifier circuit 200 comprises a cascade (or chain) of sub-amplifiers $202_1$ to $202_n$, each sub-amplifier of the cascade contributing to a respective part of the output signal 206. For example, the sub-amplifiers are connected in a cascade or chain and provide amplification for respective amplitude ranges of an input signal 204 to the output signal 206.

The cascade of sub-amplifiers comprises an end sub-amplifier $202_n$ and at least one preliminary sub-amplifier $202_1$ to $202_{n-1}$. At least one error correction block 230 is coupled to apply feedforward error correction to an output of one of the at least one preliminary sub-amplifier $202_1$ to $202_{n-1}$.

In this particular embodiment, one error correction block 230 is shown as being coupled between the outputs of the sub-amplifiers $202_1$ and $202_2$. As such, the error correction block 230 applies feedforward error correction to the output of the preliminary sub-amplifier $202_1$. Viewed another way, the output of the error correction block 230 is coupled before an output of the next sub-amplifier in the cascade, i.e. sub-amplifier $202_2$ in this example.

In this way the embodiments provide interspersed or localized error correction, in-between amplifier sections.

This has an advantage of allowing efficiency to be improved, as will be discussed later in the application.

The inputs of the sub-amplifiers 202 are coupled to an input transmission line 232 for receiving the input signal 204 and the outputs of the sub-amplifiers 202 are distributed at different places along an output transmission line 231. In some examples, delay elements are provided between the outputs of the sub-amplifiers 202 and the output transmission line 231.

In some embodiments there is a delay line (L1) connected between a reference signal 207 and an input of the at least one error correction block 230. The reference input signal 207 may be a standalone reference signal or may be taken out or split from the input signal 204.

It will be appreciated that in some embodiments of the invention there are a plurality of error correction blocks coupled to apply feedforward error correction to a plurality of respective sub-amplifiers. These error correction blocks may provide directional error amplifier based feedforward error correction or coupler based feedforward error correction. In some embodiments, there may be at least one of the error correction blocks that provides directional error amplifier based feedforward error correction, and at least one other of the error correction blocks that provides coupler based feedforward error correction. In some examples, an error correction block is coupled to each of the preliminary sub-amplifiers $202_1$ to $202_{n-1}$.

For reasons which will be discussed later, in some embodiments the at least one error correction block providing coupler based feedforward error correction is coupled to apply error correction to sub-amplifiers dedicated to lower amplitudes than the amplitudes that the amplifiers to which the at least one error correction block is providing directional error amplifier based feedforward error correction.

Figure 3A:
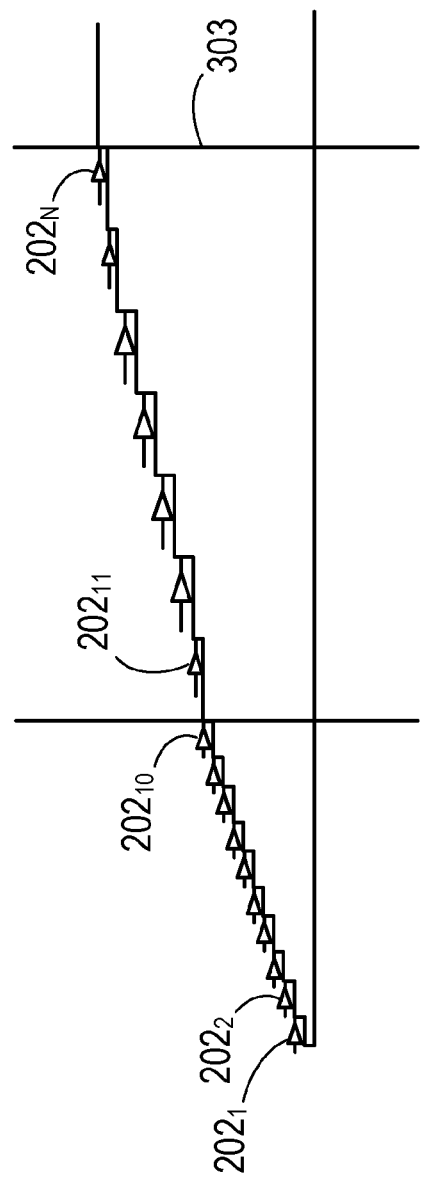
FIG. 3a shows an example of an amplifier circuit.

The sub-amplifiers can be separated by any necessary length of output transmission line while retaining the same operation and efficiency. FIG. 3a and FIG. 3b illustrate the same three-section amplifier in two versions, without and with an extra length of transmission line between sections where the preliminary sub-amplifier $202_{10}$ and $202_{11}$ are coupled (the extra length of transmission line being provided to allow an error correction block to be coupled).

It is noted that, in any of the embodiments described herein, an error correction block 230 may also be coupled to apply feedforward error correction to an output of the end sub-amplifier $202_n$ of the amplifier, in addition to the one or more error correction blocks 230 coupled to preliminary sub-amplifiers $202_1$ to $202_{n-1}$.

FIG. 3a illustrates an example of an N-stage amplifier circuit 300. The amplifier arrangement comprises N sub-amplifiers 202 with a cascade of transmission lines coupled between an output of one of the sub-amplifiers $202_1$ and an output node 303 of the amplifier arrangement 300.

In FIG. 3b an extra transmission line length 301 has been added between a first and second of the sub-amplifiers, for example between sub-amplifiers $202_{10}$ and $202_{11}$. An extra transmission line can be added between respective pairs of other sub-amplifiers, including for example between each pair of sub-amplifiers.

This separation allows the extraction, adjustment, and insertion stages of a feedforward correction system to be placed in-between the amplifier sections (instead of only at the final output of the overall amplifier circuit as with conventional high-efficiency amplifiers). For example, the separation of amplifier sections enables insertion of couplers for sampling the local output and delay for processing the error before injecting a correction signal back (in the case of feedforward correction). An amplifier circuit of the type having a plurality of cascaded sub-amplifiers of the type illustrated in FIGS. 3a and 3b enable the amplifier sections to be separated in this way, and hence allow interspersed error correction.

In some embodiments, couplers for sampling the local output may also be provided, for example for use in a predistorter. In some embodiments, up and down transformations of impedance can also be inserted, if necessary, at such local points.

Figure 4:
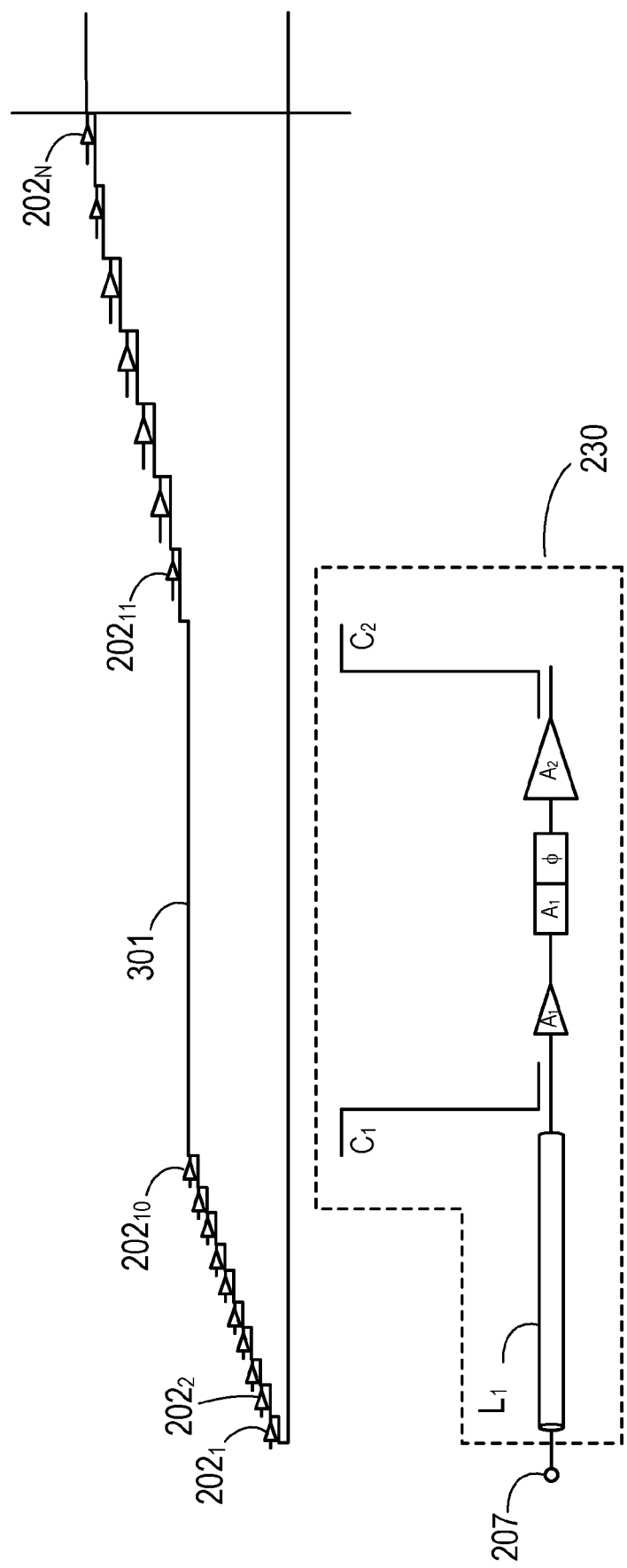
FIG. 4 shows an example of an amplifier circuit according to an embodiment.

FIG. 4 illustrates an example of the amplifier arrangement of FIG. 3b with the addition of feedforward error correction block 230. In this particular example the feedforward error correction is coupler based. The error correction block 230 comprises a signal sampling coupler C1, an error pre-amplifier A1, a gain-phase adjuster □□ an error amplifier A2, and an error injection coupler C2. The components may include impedance transformations and/or amplifier matching networks. The amplifier circuit comprises an extra transmission line length 301 inserted to allow for the processing delay of the error correction block 230, i.e. of the error amplification, coupling, and adjustments. L1 is a delay line for a reference signal 207 received at the error correction block 230. The reference signal may be a standalone reference signal or may be taken out or split from the input signal.

Figure 5:
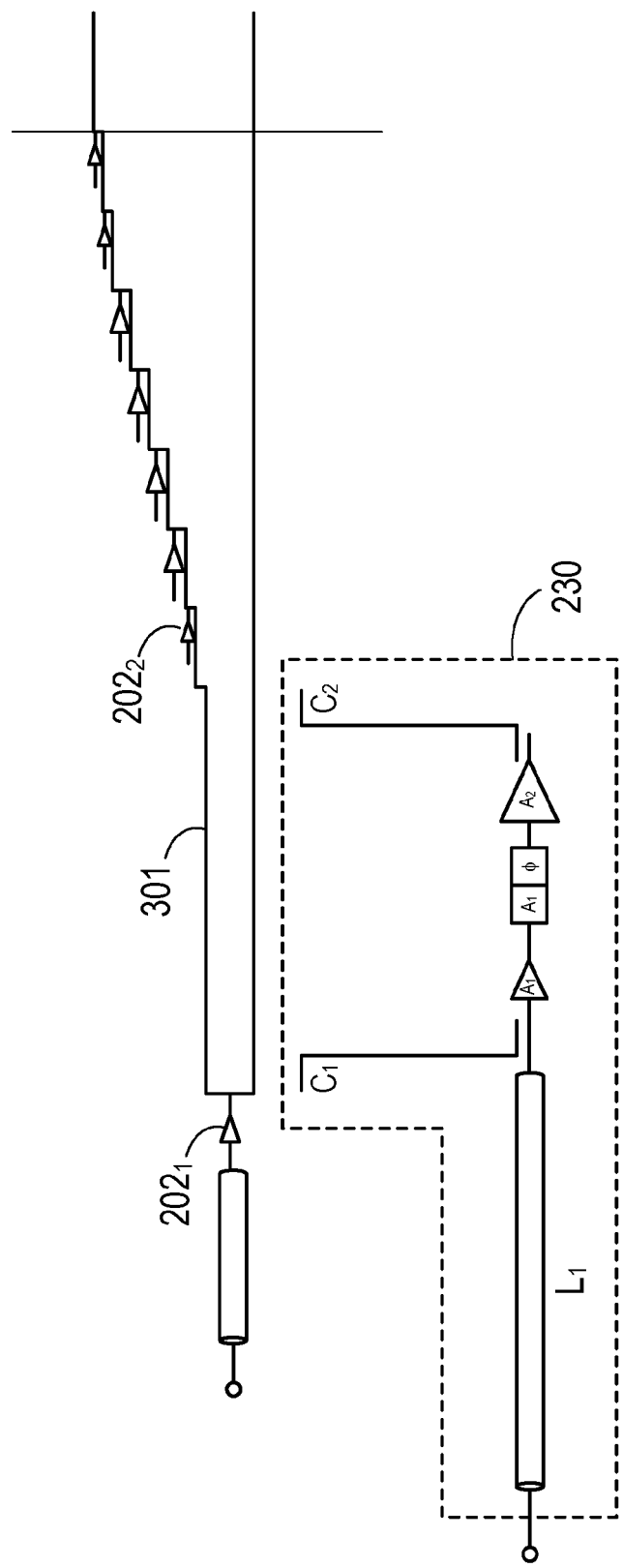
FIG. 5 shows an example of an amplifier circuit according to an embodiment.

FIG. 5 illustrates an alternative embodiment of the amplifier arrangement of FIG. 3b where the feedforward error correction and extra transmission line length 301 is added after the first sub-amplifier $202_1$ (first preliminary sub-amplifier) of the cascade.

It is noted that, in alternative embodiments, the feedforward error correction provided in FIGS. 4 and 5 may be provided as direction based feedforward error correction as described with reference to the alternatives of FIGS. 7 and 8 later.

Figure 6:
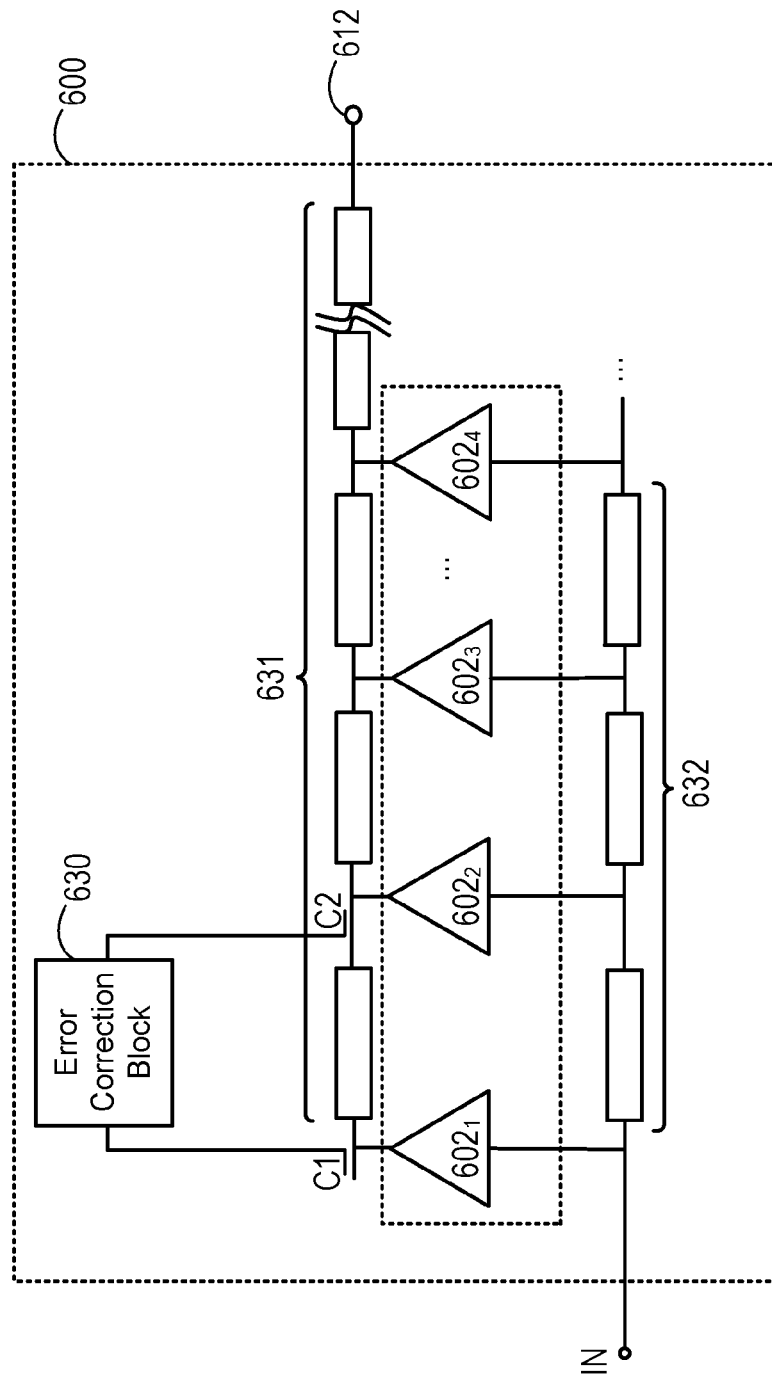
FIG. 6 shows an example of an amplifier circuit according to an embodiment.

FIG. 6 illustrates an example of an amplifier circuit 600 according to another embodiment for compensating an output signal provided at an output 612 of the amplifier circuit 600.

The amplifier circuit 600 comprises an output transmission line 631 connected to the output 612 of the amplifier circuit 600.

A reference input signal (not shown) for use by an error correction block 630 may be a standalone reference signal or may be taken out or split from the input signal IN to the circuit 600. There are different ways of deriving the input and output signals from the error correction block 630. One example is using couplers C1, C2 as show in FIG. 6.

The amplifier circuit 600 comprises multiple sub-amplifiers $602_1$ to $602_n$ (only $602_1$ to $602_4$ are shown in the example). As illustrated in FIG. 6, inputs of the multiple sub-amplifiers $602_1$ to $602_n$ are coupled to an input transmission line 632 for receiving an input signal IN, with outputs of the multiple sub-amplifiers $602_1$ to $602_n$ being coupled at respective, i.e. different, places along the output transmission line 631 to inject their respective signals onto the output signal 612.

The outputs of the sub-amplifiers $602_1$ to $602_n$ may be connected directly to the output transmission line 631 or may be connected to the output transmission line 631 via some intermediate means or coupling circuits.

Therefore, according to one embodiment, the outputs of the multiple sub-amplifiers $602_1$ to $602_n$ are coupled directly to the output transmission line 631 at different places as shown in FIG. 6. According to another embodiment, the outputs of the multiple sub-amplifiers $602_1$ to $602_n$ are coupled to the output transmission line 631 via coupling circuits. The coupling circuits may be half-wavelength networks such as cascaded pi- or T-networks consisting of half-wavelength of transmission lines or lumped or distributed impedance transformers. Use of half-wavelength networks generally limits the achievable bandwidth but enables a freer choice of impedance level.

Since it is usually difficult to access the output node of some amplifier transistors in the circuit 600 directly, a half-wavelength network is a viable way to couple the multiple sub-amplifiers to the output of the circuit. Using the half-wavelength network makes it easy to access the output node and at the same time the parasitic of the transistors may be taken into account. Thus, the first part of the half-wavelength network may consist of the parasitic or other unavoidable elements of the transistors. Parasitic elements at the transistors may also be incorporated in the design of a synthetic output transmission line.

Transformer coupling may also be feasible. Multiple sub-amplifiers are thus coupled by transformers to the different places along the output transmission line 631.

The amplifier circuit 600 further comprises an error correction block 630 coupled to apply feedforward error correction to the output of the sub-amplifier 602$_1$. A signal sampling coupler C1 samples the output of the sub-amplifier 602$_1$ and inputs the sampled signal into the error correction block 630. The error correction block 630 then couples the corrected signal, using a coupler C2, to the output of the next sub-amplifier in the cascade or chain, which in this example is sub-amplifier 602$_2$. In this example, the output of the error correction block 630 is coupled to the output transmission line before the output of the next sub-amplifier in the cascade. The error correction block 630 may be coupled to also receive a reference signal (not shown).

The error correction block 630 in any of the previous figures may be implemented in any suitable manner, including the examples in FIGS. 7 and 8 below.

FIG. 7 illustrates an example of an error correction block 730 according to an embodiment of the invention. This error correction block 730 is suitable for providing coupler based feedforward error correction.

The error correction block 730 comprises an error pre-amplifier 701 for receiving a reference signal (REF) and an output (AMP O/P) of the at least one preliminary sub-amplifier (not shown). The error correction block 730 further comprises a gain-phase adjuster 703 coupled to receive the output of the error pre-amplifier 701.

The error correction block 730 also comprises an error amplifier 705 coupled to receive an output of the gain-phase adjuster 703, and to output an error correction signal. The error correction block 730 also comprises an error injection coupler 707 (C) for coupling the error correction signal 711 to a next sub-amplifier (not shown) in the cascade.

FIG. 8 illustrates an example of an error correction block 830 according to an embodiment of the invention. This error correction block 830 is suitable for providing direction based feedforward error correction.

The error correction block 830 comprises an error pre-amplifier 801 for receiving a reference signal (REF) and an output (AMP O/P) of the at least one preliminary sub-amplifier (not shown). The error correction block 830 further comprises a gain-phase adjuster 803 coupled to receive the output of the error pre-amplifier 801.

The error correction block 830 further comprises a directional error amplifier 809 coupled to receive an output of the gain-phase adjuster 803 and output an error correction signal 811 coupled to a next sub-amplifier (not shown) in the cascade.

Figure 9:
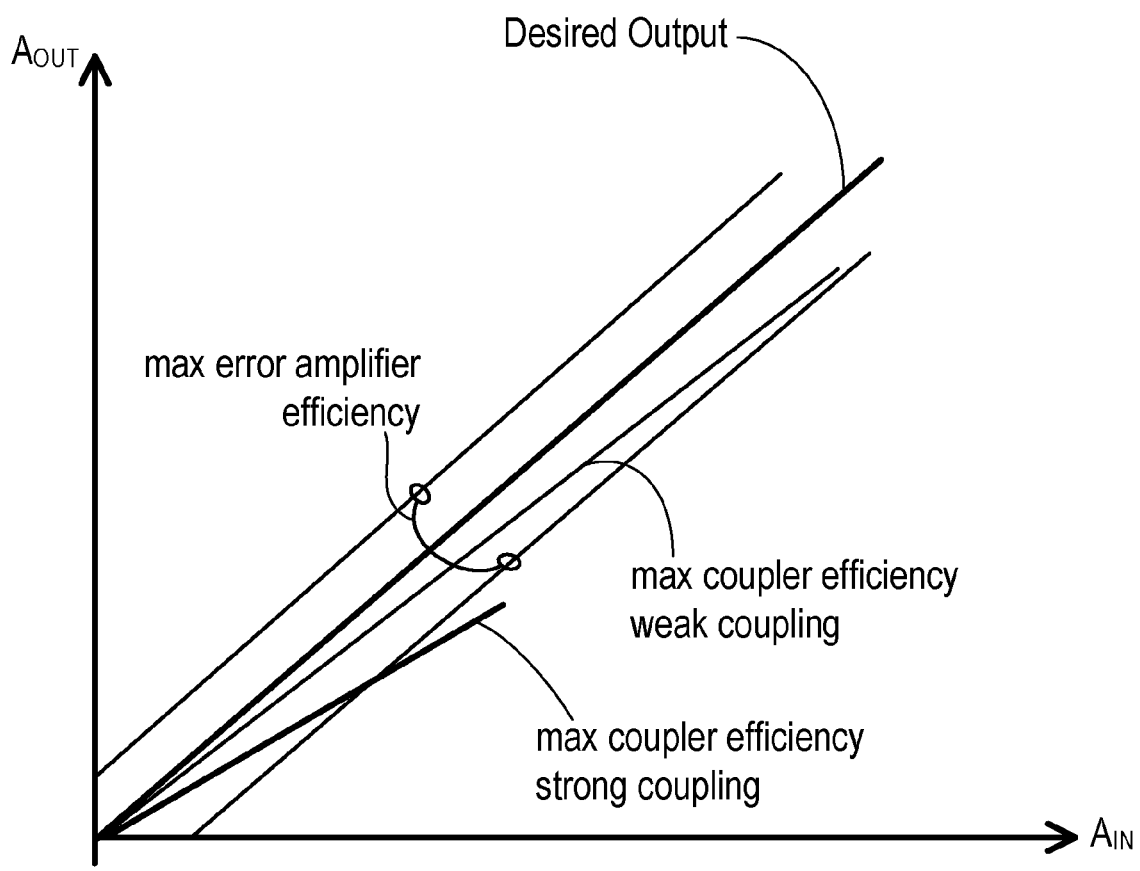
FIG. 9 illustrates a comparison of efficiency between an embodiment of the present invention and conventional techniques.

For coupler based feedforward error correction, for example using the error correction block described in FIG. 7, the embodiments of the invention can have greater advantage if the optimal coupling is substantially stronger for errors occurring at low amplitude than for errors at high amplitude. This is illustrated by the FIG. 9. The maximum efficiency for the error amplifiers is at its maximum amplitude, i.e. it lies on straight lines offset from the desired output (at a "slanted cylindrical surface" for complex gain/phase errors). In other words, since the output should be at a certain amplitude (i.e. a certain position along the x-axis) the corrections are in the vertical direction (i.e. along y-axis), but phase deviations are perpendicular to that (i.e. in-out direction). With a certain maximum amplitude available for correction, the maximum correctable deviation is then a circle around the correct output amplitude point at zero phase. These circles are perpendicular to the x-axis, but the output amplitude line is not, so the cylinder is "slanted". The maximum coupler efficiency instead lies on a straight line from the origin, i.e. at a certain fixed gain deficiency (same phase). Strong coupling is better for large gain deficiencies, and weaker coupling is better for smaller gain differences.

Using feedforward stages, i.e. error correction blocks, in-between amplifier sections thus has advantages over a single feedforward stage after the entire amplifier, since the coupling factor and error amplifier size can be optimized independently for several amplitude ranges. An example where this is beneficial is for gain deficiency errors at low amplitudes, such as those coming from soft turn-on and low gate bias of transistors.

Figure 10:
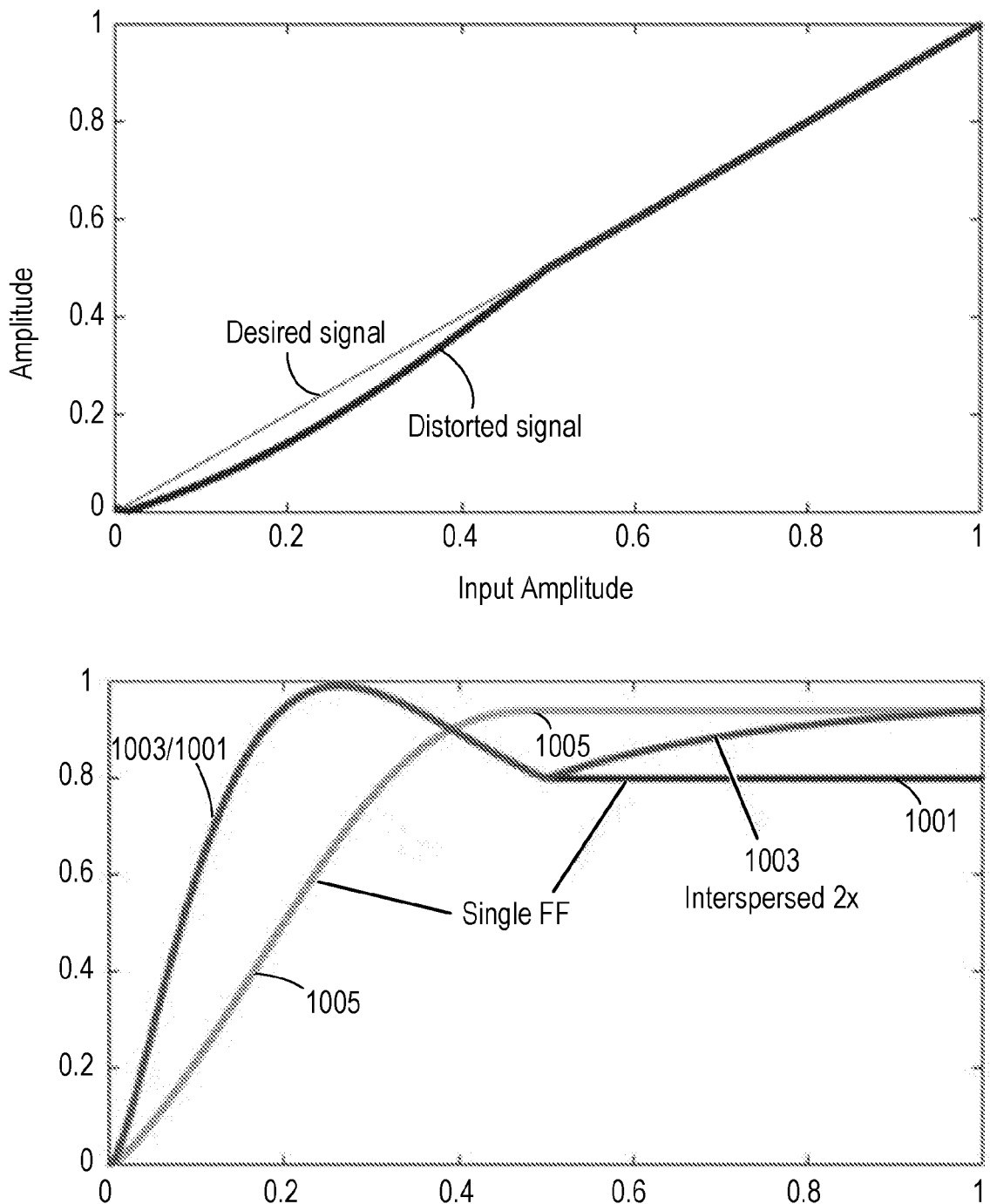
FIG. 10 illustrates a comparison of efficiency between an embodiment of the present invention and conventional techniques.

This is illustrated in FIG. 10. The upper pane of FIG. 10 shows how the error is large and concentrated at lower amplitudes. This means that strong coupling in the error injection coupler (C) will give the best efficiency in this amplitude range. For reference, the response of a single subsequent feedforward stage with strong coupling (i.e. after the entire amplifier) is represented in the lower pane of FIG. 10 by the line 1001 (partially covered by line 1003). The strong coupling means that the RF power must be increased to cover the coupling loss. Efficiency and power utilization may be improved by scaling down the amplifier power by a suitable factor so that the error amplifier can add power at higher amplitudes. However, this can cause the linearity at the higher amplitudes to suffer as the subsequent correction is worse for larger deviations.

However, when a feedforward error correction block is placed in-between the lower-amplitude and higher amplitude sections according to embodiments of the present invention, the coupling factor and efficiency can be made as high as that of the reference system in the lower amplitude region. As the errors at high amplitudes are relatively small, the coupling factor of a subsequent feedforward error correction block may be made weaker. Since the higher amplitude parts of the signal are then not subject to the high coupling loss, the efficiency is higher at high amplitudes and the RF power does not have to be increased so much. This is represented by curve 1003 in the lower pane of FIG. 10, compared to curve 1001 for a prior art single feedforward system.

The thus linearized lower amplitudes will be further corrected in a subsequent stage or stages, each time with smaller residual deviations. This will also improve linearity compared with only performing a single feedforward correction.

A single subsequent feedforward stage with the same total generated RF power as the invention, and hence lower coupling factor and low-amplitude efficiency, is shown for comparison (as curve 1005 in FIG. 10). It is noted that the efficiency curves illustrate only the efficiency behavior of the feedforward parts and with error amplifiers modeled as having linear efficiency up to 100% at full amplitude.

Figure 11:
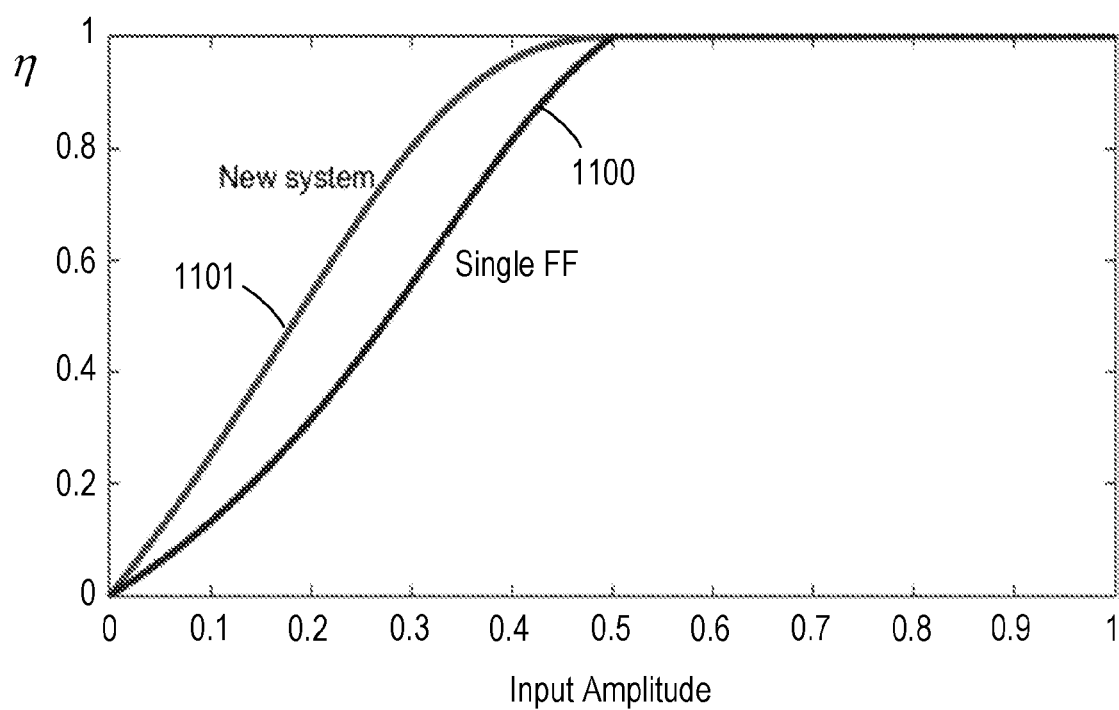
FIG. 11 illustrates a comparison of efficiency between an embodiment of the present invention and conventional techniques.

For directional error amplifier based feedforward error correction, for example using the error correction block described in FIG. 8, the efficiency characteristics of the feedforward system changes, with higher efficiency for errors at higher amplitudes and lower efficiency for errors at lower amplitudes. The resulting efficiency increase from using the embodiments described herein is also large in this case, as illustrated in FIG. 11. The curve 1100 illustrates the response with a single error correction block after the entire amplifier, and the curve 1101 represents the system of the invention relating to the directional error amplifier embodiments such as that of FIG. 8 used as the error correction block(s) between the sub-amplifiers, i.e. with one or more interspersed error correction blocks. The error is the same as in the previous example; large and concentrated at low amplitudes. Also as in the previous example, the efficiency curves illustrate only the efficiency behavior of the feedforward parts and with error amplifiers modeled as having linear efficiency up to 100% at full amplitude.

A benefit of having a first directional error amplifier based feedforward stage placed in-between the lower-amplitude and higher-amplitude amplifier sections according to the invention is that the supply voltages to the error amplifier are now lower relative to the local RF voltage amplitude. The voltage drops over the error amplifier transistors are therefore lower while the currents are the same, so the power loss is lower.

Figure 12:
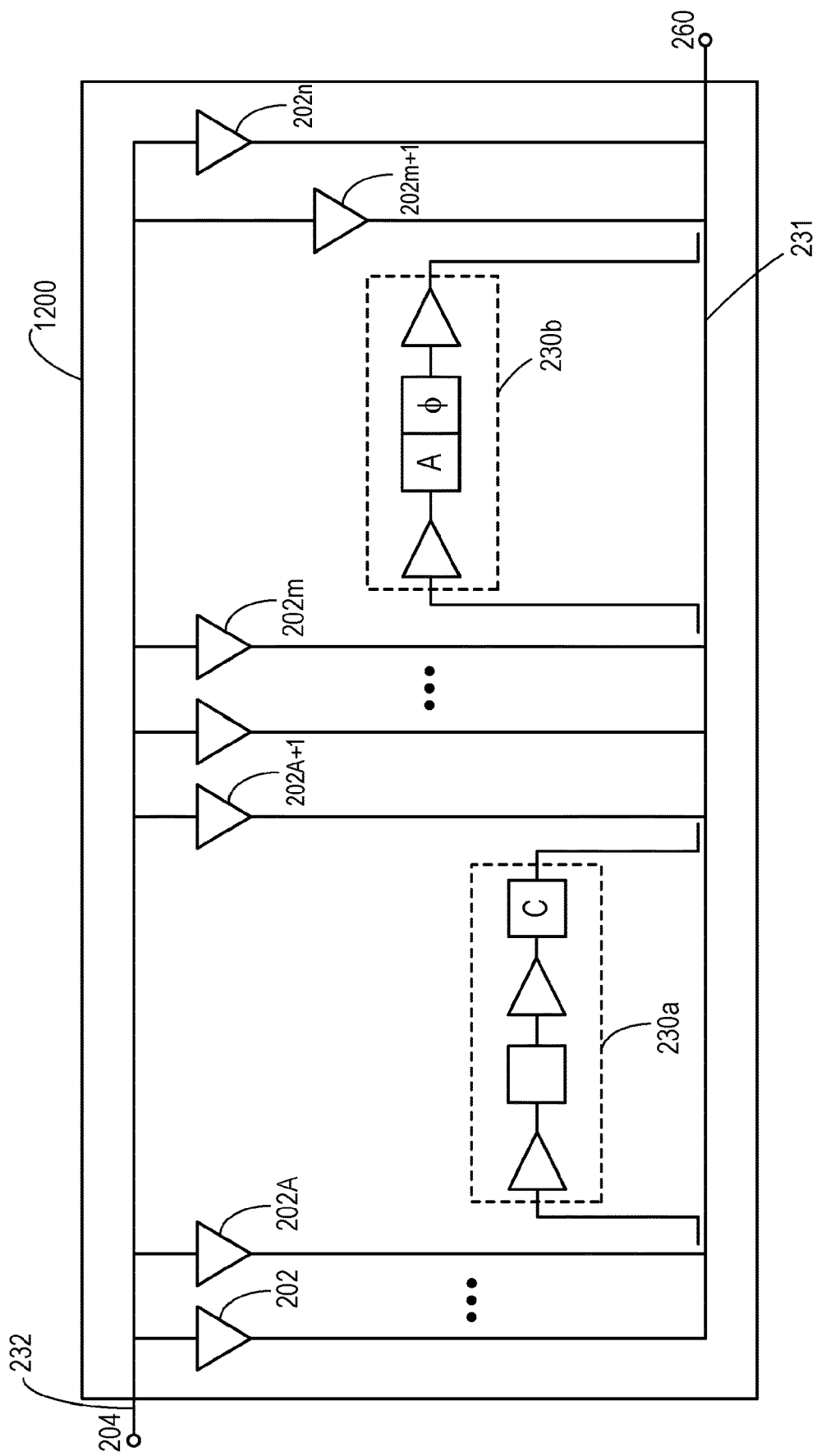
FIG. 12 shows an example of an amplifier circuit according to another embodiment.

FIG. 12 illustrates an amplifier circuit according to an embodiment of the present invention wherein at least one error correction block providing coupler based feedforward error correction is implemented, coupled to apply error correction, at lower amplitudes than at least one error correction block providing directional error amplifier based feedforward error correction.

In this particular example, the amplifier circuit 1200 comprises a cascade or chain of sub-amplifiers $202_1$ to $202_n$. The sub-amplifiers are connected in a cascade or chain and provide amplification for respective amplitude ranges of an input signal 204 to the output signal 206.

The cascade of sub-amplifiers comprises an end sub-amplifier $202_n$ and at least one preliminary sub-amplifier $202_1$ to $202_{n-1}$.

As using more local feedforward stages between amplifier sections can improve total efficiency, in this embodiment there are at least two error correction blocks. A first error correction block 230a is a coupler based error correction block. The first error correction block 230a is coupled to apply feedforward error correction to an output of the preliminary sub-amplifier $202_A$. The components of the first error correction block 230a may be as described, for example, in FIG. 7.

In this example, the first error correction block 230a is coupled to the output of the preliminary sub-amplifier $202_A$ and the output of the first error correction block 230a is coupled to the output transmission line 231 before the output of the preliminary sub-amplifier $202_{A+1}$.

A second error correction block 230b is a direction amplifier based error correction block. The second error correction block 230b is coupled to apply feedforward error correction to an output of the preliminary sub-amplifier $202_M$. The components of the second error correction block 230b may be as described in FIG. 8.

In this example, the second error correction block 230b is coupled to the output of the preliminary sub-amplifier $202_M$ and the output of the second error correction block 230b is coupled to the output transmission line 231 before the output of the preliminary sub-amplifier $202_{M+1}$.

With conventional (coupler based) feedforward, there can be a penalty if strong coupling is also used at subsequent feedforward stages (after more amplifier sections), since the signal amplified in lower amplitude stages must pass through the insertion loss of subsequent couplers. This is not the case with the new directional error amplifier based feedforward.

Therefore, in this embodiment coupler based error correction blocks have been implemented at low amplitudes sub-amplifier stages and directional error amplifier based feedforward error correction blocks are used at higher amplitudes sub-amplifier stages. Other examples can use different numbers of error correction blocks 230 of each type, including different numbers of each type.

Figure 13:
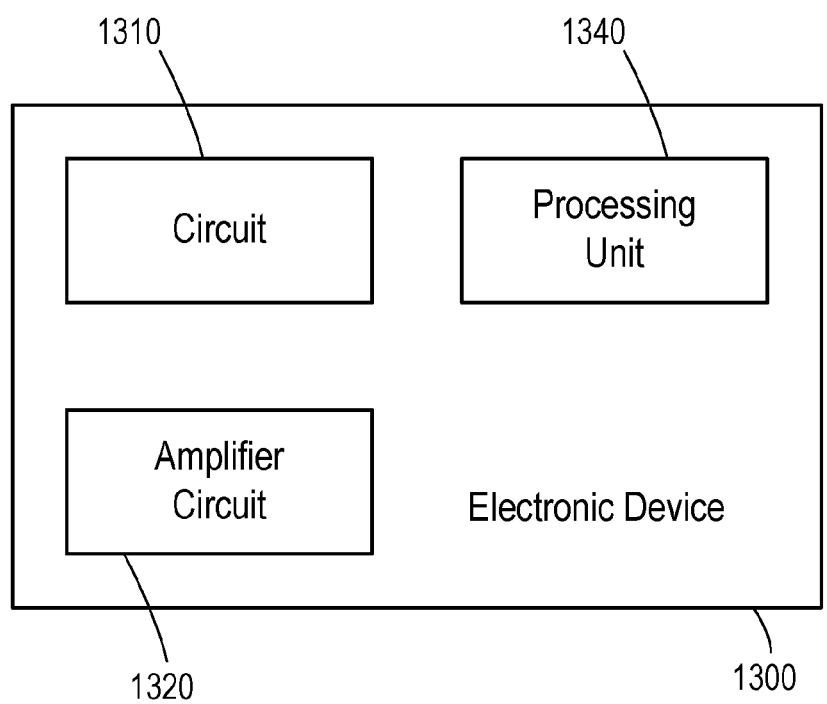
FIG. 13 shows an example of an amplifier circuit according to another embodiment.

The amplifier circuits described according to embodiments herein may be employed in various circuits in an electronic device. FIG. 13 shows a schematic block diagram illustrating an electronic device 1300, which may be, e.g. a radio frequency transceiver, a wireless communication device, a user equipment, a mobile device, a base station or a radio network node etc., in a wireless communication systems, or any general electronic systems or equipment, in which an output signal from a circuit needs to be corrected or compensated. The electronic device 1300 comprises a circuit 1310, which may be a power amplifier, a mixer, a filter, a modulator etc., where its output signal is corrected or compensated by an amplifier circuit 1320 according to embodiments described herein. The electronic device 800 may comprise other units, such as a processing unit 1340 or the like.

According to another embodiment, there is provided an amplifier circuit for compensating an output signal provided at an output of a circuit. The amplifier circuit comprises a plurality of amplifier stages, each amplifier stage contributing to a respective part of the output signal. At least one feedforward error correction block is coupled between two of the plurality of amplifier stages.

Figure 14:
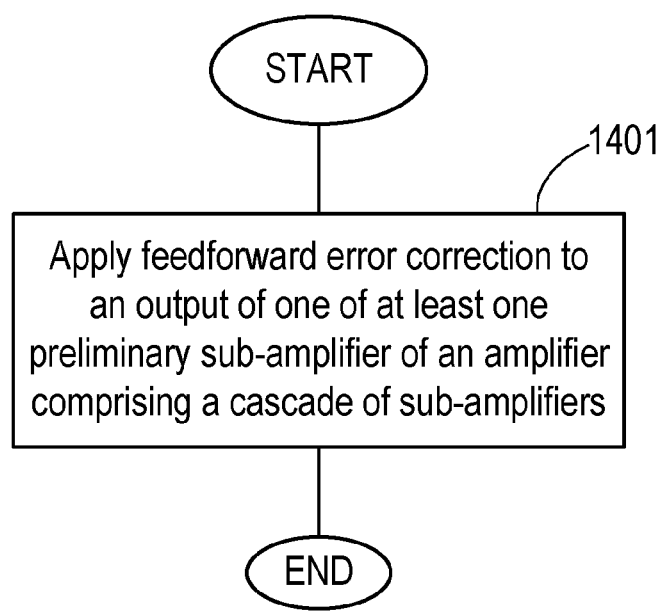
FIG. 14 shows an example of a method according to an embodiment.

FIG. 14 shows an example of a method according to another embodiment, for compensating an output signal provided at an output of an amplifier circuit, the amplifier circuit comprising a cascade of sub-amplifiers, each sub-amplifier of the cascade contributing to a respective part of the output signal, and wherein the cascade of sub-amplifiers comprises an end sub-amplifier and at least one preliminary sub-amplifier.

The method comprises the steps of applying feedforward error correction to an output of one of the at least one preliminary sub-amplifiers, step 1401.

In one example the method comprises applying feedforward error correction to a plurality of respective sub-amplifiers.

The step of applying feedforward error correction may comprise applying directional error amplifier based feedforward error correction. Alternatively, or in combination, the step of applying feedforward error correction may comprise applying coupler based feedforward error correction.

According to some embodiments the step of applying feedforward error correction comprises applying directional error amplifier based feedforward error correction to at least one preliminary sub-amplifier, and applying coupler based feedforward error correction at least one other of the preliminary sub-amplifiers.

For example, coupler based feedforward error correction may be applied at lower amplitudes than where directional error amplifier based feedforward error correction is applied.

The embodiments described herein have the advantage of providing a more efficient correction circuit, since the efficiency at backed off amplitudes can take into consideration the precision of local currents and voltages.

The embodiments described herein enable local error correction in-between amplifier sections to be performed while at a lower relative amplitude level, since only a part of the amplitude range has been added at these points. This makes it possible to increase efficiency for both variants of feedforward error correction descried in relation to the examples of FIGS. 7 and 8, since the overhead (voltage or coupler mismatch) is lowered at the point of correction.

The separation of the sub-amplifier stages, i.e. to provide local error correction, also allows insertion of other components, such as sampling couplers for local predistortion, by which the efficiency of subsequent amplifier sections and feedforward stages may be increased.

The embodiments described herein improve efficiency and linearity for the recently invented high-efficiency amplifiers together with both types of feedforward correction, as well as (to a lesser degree) with predistortion. Either type of feedforward system may be used, with relative efficiency and performance improvement depending on the characteristics of the errors. Errors at low amplitudes will experience multiple stages of correction, which improves linearity.

For the embodiments relating to coupler-based feedforward error correction, some of the main advantages relate to being able to use a different coupling factor early in the chain compared to what would be optimal for a single stage. This means that the feedforward loss can be reduced for certain types of errors occurring at low amplitudes. For example, the coupling can be made stronger, which increases efficiency for large amplitude errors of the gain-deficiency type.

When using directional error amplifier based feedforward error correction in the feedforward system, the lower relative amplitude after early amplifier stages translates directly into higher efficiency, since the supply voltages to the directional error amplifiers can be made lower. In other words, the errors themselves appear at a higher voltage relative to the supply voltages.

The embodiments have a further advantage in that the precision requirements for the apparatus and method are relatively low, since even an incomplete removal of nonlinear signal excursions at low amplitudes improves efficiency of the subsequent correction stage or stages. The linearity can be improved even with incomplete correction.

The embodiments described herein therefore have the advantage of reducing the power cost of feedforward error correction, having low precision requirements, and improving final linearity.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

The invention claimed is:

1. An amplifier circuit for compensating an output signal provided at an output of the amplifier circuit, the amplifier circuit comprising:
a plurality of sub-amplifiers comprising an end sub-amplifier and at least one preliminary sub-amplifier, wherein:
the sub-amplifiers are coupled to at least one transmission line and provide amplification for respective amplitude ranges of an input signal to the output signal, and
each sub-amplifier contributes to a respective part of the output signal; and
at least one error correction block coupled to apply feedforward error correction to respective outputs of the at least one preliminary sub-amplifier but not to an output of the end sub-amplifier.

2. The amplifier circuit of claim 1, wherein the inputs of the sub-amplifiers are coupled to an input transmission line for receiving an input signal and the outputs of the sub-amplifiers are distributed at different places along an output transmission line.

3. The amplifier circuit of claim 1, wherein an output of the error correction block is coupled to an output of a sub-amplifier that provides amplification for a next-higher amplitude range of the input signal.

4. The amplifier circuit of claim 2, wherein an output of the error correction block is coupled to the output transmission line before an output of a sub-amplifier that provides amplification for a next-higher amplitude range of the input signal.

5. The amplifier circuit of claim 1, further comprising a delay line connected between a reference signal and an input of the at least one error correction block.

6. The amplifier circuit of claim 1, wherein the at least one error correction block comprises a plurality of error correction blocks coupled to apply feedforward error correction to a respective plurality of the sub-amplifiers.

7. The amplifier circuit of claim 1, wherein the at least one error correction block is configured to provide directional-error-amplifier-based feedforward error correction.

8. The amplifier circuit of claim 1, wherein the at least one error correction block is configured to provide coupler-based feedforward error correction.

9. The amplifier circuit of claim 6, wherein a first one or more error correction blocks are configured to provide directional-error-amplifier-based feedforward error correction, and a second one or more error correction blocks are configured to provide coupler-based feedforward error correction.

10. The amplifier circuit of claim 9, wherein the second error correction blocks are configured to apply error correction at lower amplitudes than the first error correction blocks.

11. The amplifier circuit of claim 1 wherein the at least one error correction block comprises:
an error pre-amplifier for receiving a reference signal and an output of the at least one preliminary sub-amplifier.

12. The amplifier circuit of claim 11, wherein the at least one error correction block further comprises a gain-phase adjuster coupled to receive the output of the error pre-amplifier.

13. The amplifier circuit of claim 12, wherein:
the at least one error correction block is configured to provide coupler-based feedforward error correction; and
the at least one error correction block further comprises:
an error amplifier coupled to receive an output of the gain-phase adjuster, and to output an error correction signal; and
an error injection coupler for coupling the error correction signal to a sub-amplifier that provides amplification for a next-higher amplitude range of the input signal.

14. The amplifier circuit of claim 12, wherein:
the at least one error correction block is configured to provide directional-error-amplifier-based feedforward error correction; and
the at least one error correction block further comprises a directional error amplifier coupled to receive an output of the gain-phase adjuster and output an error correction signal coupled to a sub-amplifier that provides amplification for a next-higher amplitude range of the input signal.

15. The amplifier circuit of claim 2, wherein the output transmission line comprises delay elements in sections of the output transmission line associated with the preliminary sub-amplifier outputs where feedforward error correction is applied.

16. A method for compensating an output signal of an amplifier circuit comprising a plurality of sub-amplifiers comprising an end sub-amplifier and at least one preliminary sub-amplifier, wherein the sub-amplifiers are coupled to at least one transmission line and provide amplification for respective amplitude ranges of an input signal to the output signal, wherein each sub-amplifier contributes to a respective part of the output signal, the method comprising:
applying feedforward error correction to an output of one of the at least one preliminary sub-amplifiers but not to an output of the end sub-amplifier.

17. The method of claim 16, further comprising applying feedforward error correction to outputs of a plurality of the sub-amplifiers.

18. The method of claim 17, wherein applying feedforward error correction comprises applying directional-error-amplifier-based feedforward error correction.

19. The method of claim 17, wherein applying feedforward error correction comprises applying coupler-based feedforward error correction.

20. The method of claim 17, wherein applying feedforward error correction comprises:
applying directional-error-amplifier-based feedforward error correction to outputs of at least one of the preliminary sub-amplifiers; and
applying coupler-based feedforward error correction to outputs of at least one other of the preliminary sub-amplifiers.

21. The method of claim 20, wherein the coupler-based feedforward error correction is applied at lower amplitudes than the amplitudes at which the directional-error-amplifier-based feedforward error correction is applied.

* * * * *